US011921433B2

(12) United States Patent
Feng et al.

(10) Patent No.: US 11,921,433 B2
(45) Date of Patent: Mar. 5, 2024

(54) OPTICAL METROLOGY IN MACHINE LEARNING TO CHARACTERIZE FEATURES

(71) Applicant: Lam Research Corporation, Fremont, CA (US)

(72) Inventors: Ye Feng, Portland, OR (US); Yan Zhang, Fremont, CA (US); Osman Sorkhabi, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 662 days.

(21) Appl. No.: 15/733,728

(22) PCT Filed: Apr. 10, 2019

(86) PCT No.: PCT/US2019/026851
§ 371 (c)(1),
(2) Date: Oct. 6, 2020

(87) PCT Pub. No.: WO2019/200015
PCT Pub. Date: Oct. 17, 2019

(65) Prior Publication Data
US 2021/0035833 A1 Feb. 4, 2021

Related U.S. Application Data
(60) Provisional application No. 62/655,728, filed on Apr. 10, 2018.

(51) Int. Cl.
*G03F 7/00* (2006.01)
*G01B 11/24* (2006.01)
(Continued)

(52) U.S. Cl.
CPC ........ *G03F 7/706831* (2023.05); *G01B 11/24* (2013.01); *G01B 15/04* (2013.01);
(Continued)

(58) Field of Classification Search
CPC ... G01B 15/04; G01B 11/24; G03F 7/706831; G03F 7/70616; G03F 7/70625;
(Continued)

(56) References Cited

U.S. PATENT DOCUMENTS

| | | | |
|---|---|---|---|
| 5,114,233 A | 5/1992 | Clark et al. | |
| 5,421,934 A | 6/1995 | Misaka et al. | |

(Continued)

FOREIGN PATENT DOCUMENTS

| | | |
|---|---|---|
| CN | 1501178 A | 6/2004 |
| CN | 1739185 A | 2/2006 |

(Continued)

OTHER PUBLICATIONS

U.S. Office Action, dated Jan. 25, 2018, issued in U.S. Appl. No. 14/972,969.

(Continued)

*Primary Examiner* — An H Do
(74) *Attorney, Agent, or Firm* — Weaver Austin Villeneuve & Sampson LLP

(57) ABSTRACT

A metrology system may include an optical metrology tool configured to produce an optical metrology output for one or more features on a processed substrate, and a metrology machine learning model that has been trained using a training set of (i) profiles, critical dimensions, and/or contours for a plurality of features, and (ii) optical metrology outputs for the plurality of features. The metrology machine learning model may be configured to: receive the optical metrology output from the optical metrology tool; and output the profile, critical dimension, and/or contour of the one or more features on the processed substrate.

24 Claims, 4 Drawing Sheets

(51) Int. Cl.
  *G01B 15/04* (2006.01)
  *G01N 21/21* (2006.01)
  *G01N 21/55* (2014.01)
  *G01N 23/201* (2018.01)
  *G06N 3/08* (2023.01)
  *G06T 7/00* (2017.01)
  *H01L 21/67* (2006.01)

(52) U.S. Cl.
  CPC .......... *G01N 21/211* (2013.01); *G01N 21/55* (2013.01); *G01N 23/201* (2013.01); *G03F 7/70625* (2013.01); *G03F 7/706839* (2023.05); *G03F 7/706843* (2023.05); *G06N 3/08* (2013.01); *G06T 7/001* (2013.01); *H01L 21/67276* (2013.01); *G06T 2207/20081* (2013.01); *G06T 2207/30148* (2013.01)

(58) Field of Classification Search
  CPC .............. G03F 7/706843; G03F 7/705; G03F 7/706839; G06N 20/00; G06N 3/08; G01N 23/201; G01N 21/211; G01N 21/55; G06T 2207/20081; G06T 2207/30148; G06T 7/001; H01L 22/12; H01L 21/67276
  See application file for complete search history.

(56) References Cited

U.S. PATENT DOCUMENTS

| | | |
|---|---|---|
| 6,268,226 B1 | 7/2001 | Angell et al. |
| 6,410,351 B1 | 6/2002 | Bode et al. |
| 6,650,423 B1 | 11/2003 | Markle et al. |
| 6,684,382 B2 | 1/2004 | Liu |
| 6,753,115 B2 | 6/2004 | Zhang et al. |
| 6,765,651 B1 | 7/2004 | Fiekowsky et al. |
| 6,804,572 B1 | 10/2004 | Cooperberg et al. |
| 6,869,739 B1 | 3/2005 | Ausschnitt et al. |
| 6,903,826 B2 | 6/2005 | Usui et al. |
| 7,139,632 B2 | 11/2006 | Cooperberg et al. |
| 7,402,257 B1 | 7/2008 | Sonderman et al. |
| 7,504,182 B2 | 3/2009 | Stewart et al. |
| 7,588,946 B2 | 9/2009 | Tso et al. |
| 7,600,212 B2 | 10/2009 | Zach et al. |
| 7,739,651 B2 | 6/2010 | Melvin, III et al. |
| 7,812,966 B2 | 10/2010 | Hoffmann et al. |
| 7,849,423 B1 | 12/2010 | Yenikaya et al. |
| 7,921,383 B1 | 4/2011 | Wei |
| 7,962,867 B2 | 6/2011 | White et al. |
| 7,967,995 B2 | 6/2011 | Funk et al. |
| 8,001,512 B1 | 8/2011 | White |
| 8,102,408 B2 | 1/2012 | Verma et al. |
| 8,279,409 B1 | 10/2012 | Sezginer et al. |
| 8,832,610 B2 | 9/2014 | Ye et al. |
| 9,015,016 B2 | 4/2015 | Lorenz et al. |
| 9,448,470 B2 | 9/2016 | Liu et al. |
| 9,471,746 B2 | 10/2016 | Rieger et al. |
| 9,547,740 B2 | 1/2017 | Moroz et al. |
| 9,659,126 B2 | 5/2017 | Greiner et al. |
| 9,792,393 B2 | 10/2017 | Tetiker et al. |
| 9,996,647 B2 | 6/2018 | Tetiker et al. |
| 10,032,681 B2 | 7/2018 | Bailey, III et al. |
| 10,197,908 B2 | 2/2019 | Sriraman et al. |
| 10,254,641 B2 | 4/2019 | Mailfert et al. |
| 10,303,830 B2 | 5/2019 | Tetiker |
| 10,386,828 B2 | 8/2019 | Tetiker et al. |
| 10,409,946 B2 | 9/2019 | Ünal et al. |
| 10,495,967 B2 | 12/2019 | Huang et al. |
| 10,534,257 B2 | 1/2020 | Tetiker et al. |
| 10,572,697 B2 | 2/2020 | Feng et al. |
| 10,585,347 B2 | 3/2020 | Sriraman et al. |
| 10,712,672 B2 | 7/2020 | Jochemsen et al. |
| 10,977,405 B2 | 4/2021 | Bowes et al. |
| 10,997,345 B2 | 5/2021 | Feng et al. |
| 11,624,981 B2 | 4/2023 | Sriraman et al. |
| 11,704,463 B2 | 7/2023 | Feng et al. |
| 2002/0012876 A1 | 1/2002 | Angelopoulos et al. |
| 2003/0008507 A1 | 1/2003 | Bell et al. |
| 2003/0113766 A1 | 6/2003 | Pepper et al. |
| 2003/0208728 A1 | 11/2003 | Pierrat |
| 2004/0019872 A1 | 1/2004 | Lippincott et al. |
| 2005/0074907 A1 | 4/2005 | Kriz et al. |
| 2005/0192914 A1 | 9/2005 | Drege et al. |
| 2006/0064280 A1 | 3/2006 | Vi Vuong et al. |
| 2006/0141484 A1 | 6/2006 | Rucker et al. |
| 2006/0208205 A1 | 9/2006 | Chen et al. |
| 2007/0031745 A1 | 2/2007 | Ye et al. |
| 2007/0050749 A1 | 3/2007 | Ye et al. |
| 2007/0061772 A1 | 3/2007 | Ye et al. |
| 2007/0061773 A1 | 3/2007 | Ye et al. |
| 2007/0087273 A1 | 4/2007 | Look et al. |
| 2007/0249071 A1 | 10/2007 | Lian et al. |
| 2007/0281478 A1 | 12/2007 | Ikegami et al. |
| 2008/0007739 A1 | 1/2008 | Vi Vuong et al. |
| 2008/0035608 A1 | 2/2008 | Thomas et al. |
| 2008/0072207 A1 | 3/2008 | Verma et al. |
| 2008/0078948 A1 | 4/2008 | Saito |
| 2008/0243730 A1 | 10/2008 | Bischoff et al. |
| 2009/0048813 A1 | 2/2009 | Ichikawa et al. |
| 2009/0087143 A1 | 4/2009 | Jeon et al. |
| 2009/0126589 A1 | 5/2009 | Maxwell et al. |
| 2009/0242513 A1 | 10/2009 | Funk et al. |
| 2009/0253222 A1 | 10/2009 | Morisawa et al. |
| 2011/0022215 A1 | 1/2011 | Keil et al. |
| 2011/0091815 A1 | 4/2011 | Dunn et al. |
| 2011/0138343 A1 | 6/2011 | Granik |
| 2011/0159690 A1 | 6/2011 | Chandrashekar et al. |
| 2011/0188732 A1 | 8/2011 | Stroessner |
| 2011/0292375 A1 | 12/2011 | Marx |
| 2012/0002912 A1 | 1/2012 | Studenkov et al. |
| 2012/0009785 A1 | 1/2012 | Chandrashekar et al. |
| 2012/0022836 A1 | 1/2012 | Ferns et al. |
| 2012/0179282 A1 | 7/2012 | Sarma et al. |
| 2012/0228125 A1 | 9/2012 | Wu |
| 2013/0171822 A1 | 7/2013 | Chandrashekar et al. |
| 2014/0032463 A1 | 1/2014 | Jin et al. |
| 2014/0123084 A1 | 5/2014 | Tang et al. |
| 2015/0056803 A1 | 2/2015 | Chandrashekar et al. |
| 2015/0079500 A1 | 3/2015 | Shih et al. |
| 2015/0142395 A1 | 5/2015 | Cao et al. |
| 2015/0154145 A1 | 6/2015 | Watanabe et al. |
| 2015/0356233 A1 | 12/2015 | Fouquet et al. |
| 2015/0366523 A1 | 12/2015 | Ben-Haim |
| 2015/0371134 A1 | 12/2015 | Chien et al. |
| 2016/0078166 A1 | 3/2016 | Ünal et al. |
| 2016/0091769 A1 | 3/2016 | Rozbicki |
| 2016/0189971 A1 | 6/2016 | Yi et al. |
| 2016/0217233 A1 | 7/2016 | Kamon et al. |
| 2016/0284077 A1 | 9/2016 | Brill |
| 2016/0313651 A1 | 10/2016 | Middlebrooks et al. |
| 2016/0322267 A1 | 11/2016 | Kim et al. |
| 2016/0335384 A1 | 11/2016 | Song et al. |
| 2017/0004233 A1 | 1/2017 | Han et al. |
| 2017/0039308 A1 | 2/2017 | Moroz et al. |
| 2017/0115556 A1 | 4/2017 | Shim et al. |
| 2017/0147724 A1 | 5/2017 | Regli et al. |
| 2017/0176983 A1 | 6/2017 | Tetiker et al. |
| 2017/0220723 A1 | 8/2017 | Song et al. |
| 2017/0228482 A1 | 8/2017 | Tetiker et al. |
| 2017/0256463 A1 | 9/2017 | Bailey, III et al. |
| 2017/0351952 A1 | 12/2017 | Zhang et al. |
| 2017/0363950 A1 | 12/2017 | Sriraman et al. |
| 2017/0365513 A1 | 12/2017 | Yang et al. |
| 2017/0371991 A1 | 12/2017 | Tetiker et al. |
| 2018/0157161 A1 | 6/2018 | Mailfert et al. |
| 2018/0182632 A1 | 6/2018 | Ye et al. |
| 2018/0239851 A1 | 8/2018 | Ypma et al. |
| 2018/0253015 A1 | 9/2018 | Ypma et al. |
| 2018/0260509 A1 | 9/2018 | Tetiker et al. |
| 2018/0284597 A1 | 10/2018 | Weisbuch et al. |
| 2018/0314148 A1 | 11/2018 | Tetiker et al. |
| 2018/0364589 A1 | 12/2018 | Chen et al. |
| 2019/0049937 A1 | 2/2019 | Tetiker et al. |

(56) References Cited

U.S. PATENT DOCUMENTS

| | | | |
|---|---|---|---|
| 2019/0204749 A1 | 7/2019 | Tel et al. |
| 2019/0250501 A1 | 8/2019 | Sriraman et al. |
| 2019/0311083 A1 | 10/2019 | Feng et al. |
| 2020/0218844 A1 | 7/2020 | Feng et al. |
| 2020/0242209 A1 | 7/2020 | Bowes et al. |
| 2021/0080838 A1 | 3/2021 | Tel et al. |
| 2021/0150116 A1 | 5/2021 | Fan et al. |
| 2021/0157228 A1 | 5/2021 | Sriraman et al. |
| 2021/0165332 A1 | 6/2021 | Van Adrichem et al. |
| 2021/0216695 A1 | 7/2021 | Feng et al. |
| 2021/0374936 A1 | 12/2021 | Koopman et al. |
| 2023/0205076 A1 | 6/2023 | Sriraman et al. |

FOREIGN PATENT DOCUMENTS

| | | |
|---|---|---|
| CN | 1799045 A | 7/2006 |
| CN | 1868043 A | 11/2006 |
| CN | 1940715 A | 4/2007 |
| CN | 101151719 A | 3/2008 |
| CN | 101313308 A | 11/2008 |
| CN | 101359611 A | 2/2009 |
| CN | 101976045 A | 2/2011 |
| CN | 103109314 A | 5/2013 |
| CN | 104103510 A | 10/2014 |
| CN | 104518753 A | 4/2015 |
| CN | 104736744 A | 6/2015 |
| CN | 107526864 A | 12/2017 |
| EP | 1720062 A2 | 11/2006 |
| EP | 2549523 A1 | 1/2013 |
| EP | 2980646 A1 | 2/2016 |
| JP | 2002541663 A | 12/2002 |
| JP | 2003092237 A | 3/2003 |
| JP | 2004253516 A | 9/2004 |
| JP | 2005277361 A | 10/2005 |
| JP | 2005536074 A | 11/2005 |
| JP | 2007219208 A | 8/2007 |
| JP | 2008091673 A | 4/2008 |
| JP | 2009152269 A | 7/2009 |
| JP | 2009294308 A | 12/2009 |
| JP | 2010034393 A | 2/2010 |
| JP | 2012186394 A | 9/2012 |
| JP | WO2011115023 A1 | 6/2013 |
| JP | 2015103769 A | 6/2015 |
| JP | 2015528569 A | 9/2015 |
| JP | 2016033656 A | 3/2016 |
| JP | 2017135365 A | 8/2017 |
| JP | 2017-227892 A | 12/2017 |
| KR | 20010041543 A | 5/2001 |
| KR | 20060050931 A | 5/2006 |
| KR | 20080005548 A | 1/2008 |
| KR | 20130082110 A | 7/2013 |
| KR | 101460375 B1 | 11/2014 |
| KR | 20150060524 A | 6/2015 |
| KR | 20170017789 A | 2/2017 |
| TW | 200540573 A | 12/2005 |
| TW | 200710986 A | 3/2007 |
| TW | 201011474 A | 3/2010 |
| TW | 201327659 A | 7/2013 |
| TW | 201415003 A | 4/2014 |
| TW | 201433878 A | 9/2014 |
| TW | 201435621 A | 9/2014 |
| TW | 201606465 A | 2/2016 |
| TW | I528201 B | 4/2016 |
| TW | 201620009 A | 6/2016 |
| TW | 201633410 A | 9/2016 |
| TW | 201732459 A | 9/2017 |
| TW | 201742250 A | 12/2017 |
| TW | 201802574 A | 1/2018 |
| TW | 201809856 A | 3/2018 |
| WO | WO-2004015364 A1 | 2/2004 |
| WO | WO-2004015727 A2 | 2/2004 |
| WO | WO 2006/104655 A2 | 10/2006 |
| WO | WO-2014027354 A1 | 2/2014 |
| WO | WO-2015027088 A1 | 2/2015 |
| WO | WO-2016162157 A1 | 10/2016 |
| WO | WO 2018/204193 | 11/2018 |

OTHER PUBLICATIONS

U.S. Final Office Action, dated Aug. 27, 2018, issued in U.S. Appl. No. 14/972,969.
U.S. Office Action, dated Jan. 10, 2019, issued in U.S. Appl. No. 14/972,969.
U.S. Notice of Allowance, dated Apr. 5, 2019, issued in U.S. Appl. No. 14/972,969.
U.S. Office Action, dated Mar. 22, 2017, issued in U.S. Appl. No. 15/018,708.
U.S. Notice of Allowance, dated Jun. 7, 2017, issued in U.S. Appl. No. 15/018,708.
U.S. Notice of Allowance, dated Feb. 6, 2018 issued in U.S. Appl. No. 15/698,458.
U.S. Office Action, dated Oct. 2, 2017, issued in U.S. Appl. No. 15/698,458.
Office Action dated Jun. 14, 2018 issued in U.S. Appl. No. 15/972,063.
Final Office Action dated Nov. 7, 2018 issued in U.S. Appl. No. 15/972,063.
Notice of Allowance dated Feb. 1, 2019 issued in U.S. Appl. No. 15/972,063.
U.S. Office Action, dated Aug. 10, 2017, issued in U.S. Appl. No. 15/059,073.
Notice of Allowance dated Jan. 11, 2018 issued in U.S. Appl. No. 15/059,073.
U.S. Office Action, dated Dec. 7, 2017, issued in U.S. Appl. No. 15/188,910.
U.S. Final Office Action, dated May 23, 2018 issued in U.S. Appl. No. 15/188,910.
U.S. Notice of Allowance, dated Sep. 27, 2018 issued in U.S. Appl. No. 15/188,910.
U.S. Office Action, dated Jul. 10, 2019 issued in U.S. Appl. No. 16/224,651.
U.S. Notice of Allowance, dated Oct. 30, 2019 issued in U.S. Appl. No. 16/224,651.
U.S. Office Action, dated Jul. 11, 2018 issued in U.S. Appl. No. 15/367,060.
U.S. Notice of Allowance, dated Nov. 26, 2018 issued in U.S. Appl. No. 15/367,060.
U.S. Notice of Allowance, dated Jul. 23, 2019 issued in U.S. Appl. No. 15/583,610.
U.S. Office Action dated Jul. 10, 2019 issued in U.S. Appl. No. 15/946,940.
U.S. Notice of Allowance dated Oct. 16, 2019 issued in U.S. Appl. No. 15/946,940.
U.S. Office Action dated Oct. 8, 2020 issued in U.S. Appl. No. 16/741,735.
U.S. Office Action, dated Mar. 4, 2019 issued in U.S. Appl. No. 15/673,321.
U.S. Office Action dated Mar. 17, 2020 issued in U.S. Appl. No. 16/260,870.
U.S. Final Office Action dated Aug. 27, 2020 issued in U.S. Appl. No. 16/260,870.
Chinese First Office Action dated Dec. 2, 2019 issued in Application No. CN 201611166040.9.
Chinese First Office Action dated Mar. 11, 2020 issued in Application No. CN 201710475240.0.
Chinese Second Office Action dated Aug. 10, 2020 issued in Application No. CN 201710475240.0.
Singapore Notice of Eligibility for Grant and Supplemental Examination Report dated Jun. 22, 2020 issued in Application No. SG 10201705049V.
Chinese First Office Action dated Mar. 6, 2020 issued in Application No. CN 201710068974.7.
Taiwanese Notice of Allowance dated Jul. 17, 2020 issued in Application No. TW 106103883.
International Search Report and Written Opinion dated Aug. 10, 2018 issued in Application No. PCT/US2018/029874.

(56) References Cited

OTHER PUBLICATIONS

International Preliminary Report on Patentability dated Nov. 14, 2019 issued in Application No. PCT/US2018/029874.
Chinese First Office Action dated Feb. 25, 2019 issued in Application No. CN 201710121052.8.
International Search Report and Written Opinion dated Jul. 22, 2019 issued in Application No. PCT/US2019/026396.
International Preliminary Report on Patentability dated Oct. 22, 2020 issued in Application No. PCT/US2019/026396.
International Search Report and Written Opinion dated Jul. 31, 2019 issued in Application No. PCT/US2019/026851.
International Preliminary Report on Patentability dated Oct. 22, 2020 issued in Application No. PCT/US2019/026851.
International Search Report and Written Opinion dated Jul. 5, 2019 issued in Application No. PCT/US2019/025668.
International Preliminary Report on Patentability dated Oct. 15, 2020 issued in Application No. PCT/US2019/025668.
International Search Report and Written Opinion dated Jun. 5, 2020 issued in Application No. PCT/US2020/015464.
Abdo (2010) "The feasibility of using image parameters for test pattern selection during OPC model calibration," Proc. of SPIE, 7640:76401E-1-76401E-11.
Byrd, R.H., RB. Schnabel, and G.A. Shultz, "Approximate Solution of the Trust Region Problem by Minimization over Two-Dimensional Subspaces," Mathematical 5 Programming, vol. 40, pp. 247-263 (1988).
Cooperberg, D.J., et al. (Sep./Oct. 2002) "Semiempirical profile simulation of aluminum etching in a $Cl_2$ / $BCl_3$ plasma," *Journal of Vacuum Science & Technology A.*, 20(5):1536-1556 [doi: http://dx.doi.org/10.1116/1.1494818].
Cramer et al., "High-NA optical CD metrology on small in-cell targets enabling improved higher order 10 dose control and process control for logic," Proceedings of SPIE,10145, Metrology, Inspection, and Process Control for Microlithography XXXI, 101451B (Mar. 28, 2017).
"SEMulator3D," Product Brochure, COVENTOR, A Lam Research Company, 3 pp. (*known as of Mar. 2, 2018*) <URL:https://www.coventor.com/semiconductor-solutions/semulator3d/>.
"SEMulator3D Advanced Modeling," Web page, COVENTOR, A Lam Research Company, 5 pp. <URL: https://www.coventor.com/semiconductor-solutions/semulator3d/semulator3d-advanced-modeling/> (*known as of Mar. 2, 2018*).
"SEMulator3D," Web page, COVENTOR, A Lam Research Company, 5 pp. <URL:https://www.coventor.com/semiconductor-solutions/semulator3d/> (*known as of Mar. 2, 2018*).
Goodlin et al. (May 2002) "Quantitative Analysis and Comparison of Endpoint Detection Based on Multiple Wavelength Analysis," *201st Meeting of the Electrochemical Society, International Symposium on Plasma Processing XIV*, Abs. 415, Philadelphia, PA, 30 pages.
Hoekstra, R. et al. (Jul./Aug. 1997) "Integrated plasma equipment model for polysilicon etch profiles in an inductively coupled plasma reactor with subwafer and superwafer topography," *Journal of Vacuum Science & Technology A*, 15(4):1913-1921. [doi:http://dx.doi.org/10.1116/1.580659].
Hoekstra, R. et al. (Jul./Aug. 1998) "Microtrenching resulting from specular reflection during chlorine etching of silicon," *Journal of Vacuum Science & Technology B, Nanotechnology and Microelectronics*, 16(4):2102-2104 [doi: http://dx.doi.org/10.1116/1.590135].
Hoekstra, R. et al. (Nov. 1, 1998) "Comparison of two-dimensional and three-dimensional models for profile simulation of poly-Si etching of finite length trenches," *Journal of Vacuum Science & Technology A*, 16(6):3274-3280 [doi:http://dx.doi.org/10.1116/1.581533].
Huard, C.M., et al. (Jan. 17, 2017) "Role of neutral transport in aspect ratio dependent plasma etching of three-dimensional features," *Journal of Vacuum Science & Technology A.*, 35(5):05C301-1-05C301-18. [doi: http://dx.doi.org/10.1116/1.4973953].

Kushner, M.J., (Sep. 18, 2009) "Hybrid modelling of low temperature plasmas for fundamental investigations and equipment design," *Journal of Physics D.*, 42(1904013):1-20 [doi: 10.1088/0022-3727/42/19/194013].
Lynn et al. (2009) "Virtual Metrology for Plasma Etch using Tool Variables," *IEEE*, pp. 143-148.
Lynn, Shane (Apr. 2011) "Virtual Metrology for Plasma Etch Processes," *A thesis submitted in partial fulfillment for the degree of Doctor of Philosophy in the Faculty of Science and Engineering, Electronic Engineering Department*, National University of Ireland, Maynooth, 361 pages.
Moharam et al. (Jul. 1981) "Rigorous coupled-wave analysis of planar-grating diffraction," *J. Opt. Soc. Am.*, 71(7):811-818.
More, J.J. and D.C. Sorensen, "Computing a Trust Region Step," SIAM Journal on Scientific and Statistical Computing, vol. 3, pp. 553-572, (1983).
More, J.J., "The Levenberg-Marquardt Algorithm: Implementation and Theory," Numerical Analysis, ed. G. A Watson, Lecture Notes in Mathematics 630, Springer Verlag, pp. 105-116 (1977).
Radjenović et al. (2007) "3D Etching profile evolution simulations: Time dependence analysis of the profile charging during SiO2 etching in plasma," *5th EU-Japan Joint Symposium on Plasma Process, Journal of Physics: Conference Series*, 86:13 pages.
Ringwood et al. (Feb. 2010) "Estimation and Control in Semiconductor Etch: Practice and Possibilities," *IEEE Transactions on Semiconductor Manufacturing*, 23(1):87-98.
Sankaran, A. et al. (Jan. 15, 2005) "Etching of porous and solid $SiO_2$ in $Ar/c-C_4F_8$, $O_2/c-C_4F_8$ and $Ar/O_2/c-C_4F_8$ plasmas," *Journal of Applied Physics*, 97(2):023307-1-023307-10. [doi: http://dx.doi.org/10.1063/1.1834979] [retrieved on Jan. 29, 2005].
Sankaran, A. et al. (Jul./Aug. 2004) "Integrated feature scale modeling of plasma processing of porous and solid $SiO_2$. I. Fluorocarbon etching," *Journal of Vacuum Science & Technology A.*, 22(4):1242-1259 [doi: http://dx.doi.org/10.1116/1.1764821].
Yue et al. (Jan./Feb. 2001) "Plasma etching endpoint detection using multiple wavelengths for small open-area wafers," *J. Vac. Sci. Technol. A*, 19(1):66-75.
Zeng (2012) "Statistical Methods for Enhanced Metrology in Semiconductor/Photovoltaic Manufacturing," A dissertation submitted in partial satisfaction of the requirements for the degree of Doctor of Philosophy in Engineering—Electrical Engineering and Computer Sciences in the Graduate Division of the University of California, Berkeley, 171 pages.
Zhang, D. et al. (Mar./Apr. 2001) "Investigations of surface reactions during $C_2F6$ plasma etching of $SiO_2$ with equipment and feature scale models," *Journal of Vacuum Science & Technology A*, 19(2):524-538 [doi: http://dx.doi.org/10.1116/1.1349728].
Zhang, Y., (Sep. 30, 2015) Doctoral Dissertation of "Low Temperature Plasma Etching Control through Ion Energy Angular Distribution and 3-Dimensional Profile Simulation," *Dept. of Electrical Engineering at the University of Michigan*, pp. 49-71, Appendix B. pp. 243-248 [doi:http://hdl.handle.net/2027.42/113432].
U.S. Appl. No. 15/733,728, filed Oct. 6, 2020, Feng et al.
Chinese First Office Action dated Aug. 16, 2021 issued in Application No. CN 201880044397.0.
Chinese Third Office Action dated Nov. 18, 2020 issued in Application No. CN 201710475240.0.
CN Office Action dated Apr. 26, 2022, in Application No. CN201880044397 with English translation.
CN Office action dated Aug. 16, 2021 in CN Application No. CN201880044397 with English translation.
CN Office action dated Jan. 13, 2022 in CN Application No. CN201880044397 with English translation.
European Extended Search Report dated Feb. 10, 2021 issued in EP Application No. EP 18794270.
Japanese First Office Action dated Feb. 16, 2021 issued in Application No. JP 2017-020050.
Japanese First Office Action dated Mar. 24, 2021 issued in Application No. JP 2017-037874.
JP Office Action dated Jun. 14, 2022 in Application No. JP20190559822.
JP Office Action dated Oct. 18, 2022, in Application No. 2021-152896 with English translation.

(56) References Cited

OTHER PUBLICATIONS

KR Office Action dated Apr. 15, 2022, in application No. KR1020170026906 with English Translation.
KR Office Action dated Dec. 16, 2022, in Application No. KR10-2019-7035372 with English translation.
KR Office Action dated Dec. 29, 2022 in Application No. KR10-2022-0086361 with English translation.
KR Office Action dated May 16, 2022, in Application No. KR1020170077116 with English translation.
KR Office Action dated Oct. 19, 2021, in application No. KR10-2017-0077116 with English Translation.
KR Office Action dated Oct. 22, 2021, in application No. KR10-2017-0026906 with English Translation.
Taiwanese First Office Action dated Dec. 10, 2020 issued in Application No. TW 106120279.
Taiwanese First Office Action dated Dec. 7, 2020 issued in Application No. TW 106106609.
TW Office Action dated Aug. 17, 2022, in Application No. TW108112113 With English Translation.
TW Office Action dated Aug. 10, 2023, in application No. TW108112271 with English Translation.
TW Office Action dated Jan. 10, 2023 in Application No. TW108112271 with English translation.
TW Office Action dated Jan. 19, 2023, in Application No. TW108112113 with English translation.
TW Office Action dated Mar. 22, 2022, in Application No. TW107114630 with English translation.
TW Office Action dated May 23, 2023, in Application No. TW109102831 with English translation.
TW Office Action dated May 30, 2023 in Application No. TW108112113 with English translation.
TW Office Action dated Sep. 7, 2022, in Application No. TW108112271 with English translation.
U.S. Corrected Notice of Allowance dated Jun. 12, 2023, in U.S. Appl. No. 17/301,345.
U.S. Final office Action dated Jun. 17, 2022 in U.S. Appl. No. 17/045,168.
U.S. Non-Final office Action dated Sep. 9, 2022 in U.S. Appl. No. 17/301,345.
U.S. Notice of Allowance dated Dec. 9, 2020 issued in U.S. Appl. No. 16/260,870.
U.S. Notice of Allowance dated Feb. 15, 2023 in U.S. Appl. No. 17/301,345.
U.S. Notice of Allowance dated Jan. 13, 2021 issued in U.S. Appl. No. 16/741,735.
U.S. Notice of Allowance dated Nov. 30, 2022 in U.S. Appl. No. 17/045,168.
U.S. Office Action dated Feb. 22, 2022 issued in U.S. Appl. No. 17/045,168.
CN Office Action dated Dec. 8, 2023 in CN Application No. 201980025007.X with English Translation.
KR Office Action dated Dec. 15, 2023 in KR Application No. 10-2020-7032501 with English Translation.

OPTICAL METROLOGY IN MACHINE LEARNING TO CHARACTERIZE FEATURES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The performance of semiconductor device fabrication operations such as plasma-assisted etch processes is often essential to the success of a semiconductor device processing workflow. However, optimization or tuning of the fabrication processes and/or the tools associated with them (e.g., etch reactors, lithography masks, etc.) may prove technically difficult and time-consuming, often involving skilled personnel manually adjusting etch process parameters or tool component designs to generate the desired target feature profile. Metrology tools should accurately gauge the performance of etch or deposition processes by measuring features on fabricated or partially fabricated devices. Currently, various metrology tools are used for this purpose.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Certain aspects of this disclosure pertain to method of determining a profile, critical dimension, and/or contour of one or more features on a processed substrate. Such methods may be characterized by the following features: (a) performing optical metrology on the one or more features on the processed substrate to produce an optical metrology output; (b) providing the optical metrology output to a metrology machine learning model that has been trained using a training set of (i) profiles, critical dimensions, and/or contours for a plurality of features, and (ii) optical metrology outputs for the plurality of features; and (c) receiving, from the metrology machine learning model, the profile, critical dimension, and/or contour of the one or more features on the processed substrate. In certain embodiments, the methods additionally include training the metrology machine learning model by producing multiple sets of optical metrology output, each generated for a different orientation and/or location of test features with respect an optical metrology apparatus, for the test features. In certain embodiments, the metrology machine learning model was produced using a supervised machine learning technique.

In certain embodiments, the optical metrology is a scatterometry technique. For example, the optical metrology output may include a reflectance spectra and/or ellipsometric output data.

In certain embodiments, the methods additionally include performing pattern recognition on the one or more features on the processed substrate; and determining that a pattern of the one or more features conforms with an expected pattern.

In certain embodiments, the methods additionally include performing optical metrology on the one or more features on the processed substrate includes raster scanning over the processed substrate.

In some cases, the profiles, critical dimensions, and/or contours for a plurality of features in the training set were obtained using an electron microscopy technique and/or using CD-SAXS.

In certain embodiments, the methods additionally include decomposing the optical metrology output to produce a reduced set of optical metrology values and providing the reduced set of optical metrology values to the metrology machine learning model. In some cases, decomposing the optical metrology output includes identifying principal components of the optical metrology output or applying the optical metrology output to an autoencoder.

Other aspects of the disclosure pertain to metrology systems that may be characterized by the following elements: (a) an optical metrology tool including an optical probe source and an optical detector and a processor configured to produce an optical metrology output from data produced by the optical detector when an optical probe is directed onto one or more features on a processed substrate; and (b) a metrology machine learning model that has been trained using a training set of (i) profiles, critical dimensions, and/or contours for a plurality of features, and (ii) optical metrology outputs for the plurality of features. In certain embodiments, the metrology machine learning model is configured to: receive the optical metrology output from the optical metrology tool; and output the profile, critical dimension, and/or contour of the one or more features on the processed substrate.

In some systems, the metrology machine learning model was trained using multiple sets of optical metrology output, each generated for a different orientation and/or location of test features with respect a test optical metrology apparatus. In some embodiments, the metrology machine learning model was generated using a supervised machine learning technique.

In certain embodiments, the optical metrology tool is a scatterometer. In some metrology systems, the optical metrology output inlcudes a reflectance spectra and/or ellipsometric output data.

Some metrology systems additionally include a pattern recognition tool comprising a camera and processor configured to: perform pattern recognition on the one or more features on the processed substrate; and determine that a pattern of the one or more features conforms with an expected pattern. In some metrology systems, the optical metrology tool is configured to raster scan over the processed substrate.

In some metrology systems, the profiles, critical dimensions, and/or contours for a plurality of features in the training set were obtained using an electron microscopy technique and/or by using CD-SAXS.

In certain embodiments, the metrology machine learning model is further configured to: decompose the optical metrology output to produce a reduced set of optical metrology values and provide the reduced set of optical metrology values to the metrology machine learning model. In some such embodiments, the metrology machine learning model is configured to decompose the optical metrology output by identifying principal components of the optical metrology output or by applying the optical metrology output to an autoencoder.

These and other features will be described below with reference to the associated drawings.

DESCRIPTION

Figure 1:
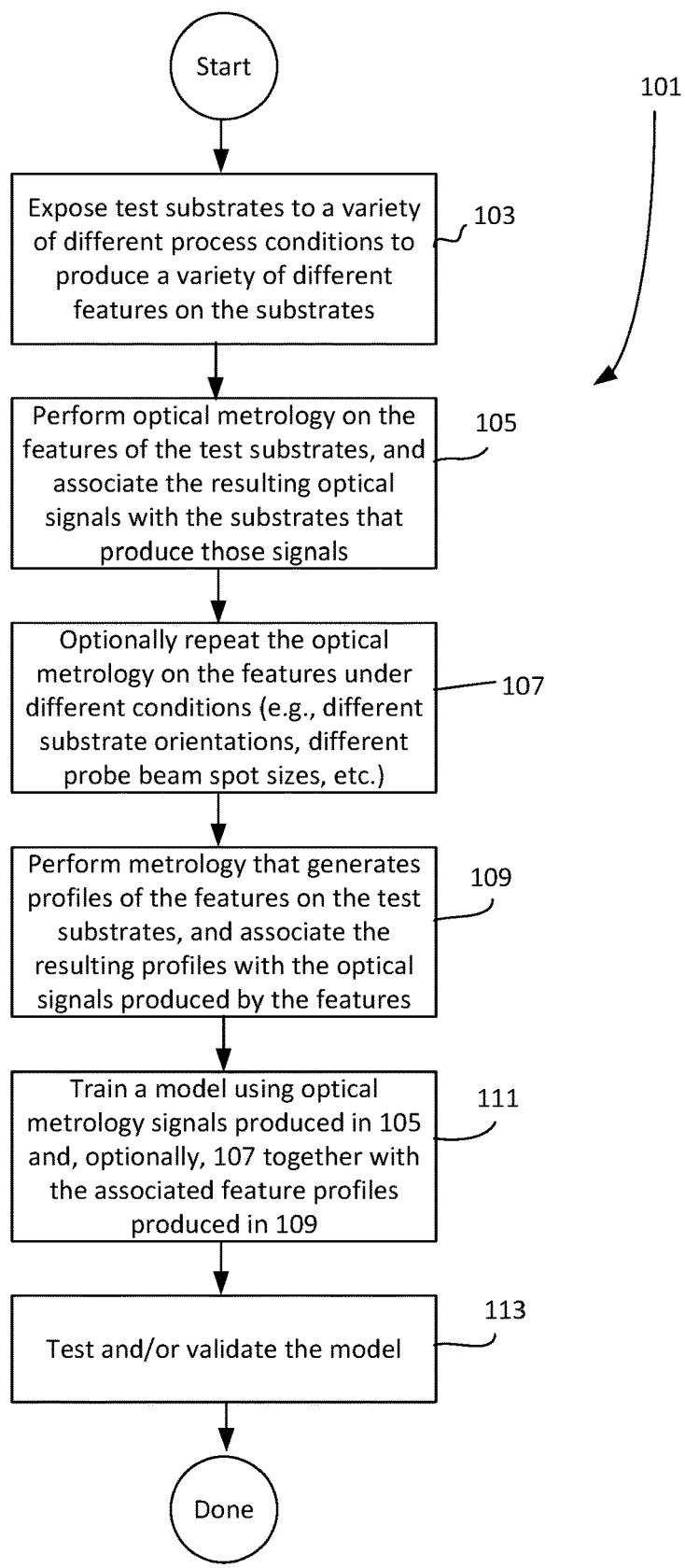
FIG. 1 presents a flow chart for generating a metrology machine learning model in accordance with certain method embodiments of this disclosure.

Current methods of evaluating semiconductor wafers and other samples used in semiconductor process development employ techniques such as x-SEM (x-ray Scanning Electron Microscopy), STEM (Scanning Transmission Electron Microscopy), and CD-SAXS (Critical Dimension Small Angle X-ray Scattering) for cross-sectional image capture. Current methods then use image analysis software to extract the feature of interest. Coupons are often used instead of full wafers to study the effect of etch or other fabrication processes on patterned substrates. Coupons are test samples or substrates that typically have materials and layers that are identical to or resemble those materials and layers used in a semiconductor device fabrication operation. Frequently, coupons are smaller than semiconductor wafers. They may be circular or polygonal (e.g., rectangular) and occupy only a few square centimeters.

Among the challenges sometimes encountered with current electron microscopy-based approach are the following.
1. The cost of x-SEM and STEM is high and the speed of CD-SAXS is slow;
2. Due to line-edge roughness, the error bar of each x-SEM / STEM image is high; to reduce this error, more cross sections are needed, which drives the cost even higher.
3. Features are extracted manually and prone to operator error and/or operator-to-operator variability.
4. STEM and x-SEM are destructive, and therefore require repeating all prior fabrication operations to accurately consider each etch step, and thereby enable a complete understanding of full etch effect. However, there is no guarantee that the multiple coupons cross sectioned at different steps are the same. Small differences in these coupons, either from incoming conditions or from etch conditions may contribute large errors in process development.

Disclosed herein are methods and systems for supervised machine learning using spectra collected off coupon samples to generate models that can easily and accurately predict feature characteristics normally obtained by a destructive metrology technique such as electron microscopy (e.g., x-SEM and STEM) or by another time consuming process such as CD-SAXS. During training, many samples may be processed according to a defined process (e.g., etch or deposition) and then cross sectioned to extract the profile information useful for process development and/or process monitoring. Models trained using this information can receive optical signals from optical metrology tools—which tend operate quickly, inexpensively, and non-destructively—and output the ground truth of features established by another metrology tool—which tend to operate slowly, expensively, and often destructively.

In some cases, the profile information may suffer from inaccuracy due to feature extraction off of blurry boundaries in micrographs or other images. If a sufficiently large training set is used (e.g., at least about 20 samples, or at least about 100 samples), and each of these samples is evaluated using both electron microscopy (and/or CD-SAXS) and optical metrology (e.g., x-SEM and STEM is conducted along with measuring spectra) on the feature of interest, the method can enable reliable supervised training.

In some cases, at least some of the samples are evaluated at locations where a single type of feature occupies at least a significant fraction of an optical spot created by incident light on the sample. Often the features of interest have dimensions on the order of a few hundred nanometers or less, while optical spots are on the order of 5-40 micrometers. For a single feature to make a strong contribution to the optical signals obtained from the metrology tool, when spot sizes are significantly larger than feature sizes, the feature may need to be repeated over the area occupied by the incident spot. However, this is not a rigid requirement of the samples/locations used in the training set. Many machine learning techniques are sufficiently robust that at least some training set members (or at least their optical metrology signals) can have contributions of multiple types of features in an optical signal. Regardless of the composition of the training set, the pairing of spectra and CD, profile, and/or contour information extracted using a reliable profiling technique such as x-SEM, STEM, CD-SAXS or other destructive or slow metrology can enable a supervised training.

Note that the training is supervised in the sense that the destructive metrology technique (e.g., x-SEM/STEM) or other slow profiling technique provides known feature characteristics such as a feature's profile, contour, or critical dimension (CD) that are used to identify optical signal characteristics that correspond to the known feature characteristics. The resulting model can accurately predict feature profile information when supplied with optical data collected under conditions used to train the model. In the methods and systems described here, there may be two implementation steps—training and testing. Ultimately, a generated and validated metrology machine learning model may be employed in an optical metrology system to directly provide information about feature profiles, CDs, and/or contours.

Training

In certain embodiments, the training employs scatterometry to capture the reflected spectra using a range of optical information, which may span ranges of angle of incidence (normal incidence and oblique incidence), azimuthal direction including a full 360 degrees, wavelength (e.g., including visible, infrared, and/or ultraviolet), and polarization on the feature of interest. After collecting this optical metrology information, the coupons are analyzed by x-SEM, TEM, CD-SAXS, or the like. An accumulation of several samples (e.g., greater than about 20 samples or greater than about 100 samples) may be employed. Each such sample may generate one or more training set member. For example, a single sample may be analyzed using a plurality of optical metrology settings (e.g., angles of incidence), each setting producing a separate optical metrology reading and associated training set member.

It can be challenging to position and/or orient a coupon in an error-free manner. While metrology tools are designed to fine tune the position and orientation of wafers that have standard sizes, and thereby provide relatively low error capture of optical metrology results, these tools are not designed to so carefully control the position and orientation of coupons. Coupons frequently have sizes and shapes that are much different from the sizes and shapes of production wafers. Therefore steps may need to be taken to address the possible errors in optical metrology signals produced from coupons.

In certain embodiments, positional and/or rotational error is reduced by translating, rotating, and/or otherwise reorienting the sample different ways under the beam of an optical metrology tool and capturing optical signals at all these different positions or orientations. Each of the different positions/orientations may present the same location for the spot of a beam of the optical metrology tool. Collectively, these different positions average out error that might occur in a small fraction of the different translational positions and/or orientations. For training, each of the different optical signals captured at these different positions or orientations is associated with the same x-SEM, STEM, CD-SAXS, or other direct measurement. Thus, a given position on a sample (coupon) may produce a large number of training set members, each using the same x-SEM, STEM, or CD-SAXS measurement but different optical signals obtained at different translational positions or orientations. Collectively, the number of such training set members is large enough to cover realistic error of typical experimental conditions.

As should be apparent, each sample subject to optical metrology is subsequently sent to an x-SEM apparatus, a TEM apparatus, a CDSAXS apparatus, or other apparatus for conducting measurement on features having been produced by a process under consideration. The destructive process provides information for extracting the CD, profile, contour, or other characteristics of features.

Z-direction resolved information can be obtained, as noted, by non-destructive (or less destructive) techniques such as CD-SAXS (critical dimension small angle X-ray scattering). CD-SAXS is an X-ray scattering technique that can be used to reconstruct the in-plane and out-of-plane structure of nanostructured thin-films. The technique involves collecting a series of transmission small angle X-ray scattering images, at a variety of sample rotation angles. These $(q_x,q_y)$ images can be combined to reconstruct the 3D reciprocal space (e.g., Fourier transformed), in particular probing the $(q_y,q_z)$ slice that contains both in-plane and out-of-plane (film normal direction) information.

Training may start using, e.g., about 100 pairs of spectra and CD values, profiles, and/or contours. Different supervised learning techniques can be employed (regression, decision tree, support vector machine, neural networks, etc.) to map the relationship between spectra and CD/ profile/ contour features. Hyper-parameters may be optimized to ensure best validation result before testing. If other information pertaining to coupon-to-coupon variations, e.g., layer thicknesses and optical constants, is available, it can also be used as the input to supervised learning.

In one implementation, the supervised training method utilizes a dimensionality reduction technique/tool such as principal component analysis (PCA) or an autoencoder. The dimensionality reduction technique is optionally used in conjunction with producing a neural network or other supervised machine learning model. For example, PCA may be employed to identify optical signal characteristics or combinations of optical signal characteristics from optical metrology signals that are affected relatively strongly, compared to other optical signal characteristics, by a feature characteristic of interest such as feature critical dimension.

The resulting principal components (vectors of optical signal characteristics that are strongly affected by features of interest) are used in training the model and as inputs to resulting model. More generally, any technique that decomposes or identifies aspects of optical signals for use in training a model (and as inputs to subsequently generated models) may be employed. Any such technique may receive n spectral intensity values (from optical metrology) that result from m sources of variation in substrate features and identify approximately m unique spectral signatures. The value of n will typically be much greater than the value of m, e.g., but at least an order of magnitude.

In another implementation, a deep learning neural network is employed in a manner that does not require a principal components extraction step. As with the PCA-neural network implementation, once training is done to produce a deep learning model with sufficient accuracy to predict the CD, contour, and/or profile information, it can circumvent x-SEM, STEM, CD-SAXS and the like to directly report the above information (e.g., feature profiles or geometric characteristics of the features).

With the averaging power of optical technology on large targets, this method provides average CD/contour/profile information more effectively than multiple x-SEM, STEM, CD-SAXS, etc. measurements. Periodic structures are most useful due to their translational invariance, but the methods are not limited to periodic structures.

In certain embodiments, the training can be supplemented with pattern data representing an expected pattern at the locations on a sample where optical metrology obtains signal and the SEM cross-section is taken. Standard pattern recognition software is available to take camera images of such locations and determine whether the location has an expected pattern. If the location does not have the expected pattern, optical and microscopy data may not be acquired, or if it is acquired, may be eliminated or given low weight in the model training.

The non-invasive metrology data used to train the model can come from any of various conventional and unconventional optical techniques. Such techniques may capture reflectance and/or ellipsometric spectra using, e.g., scatterometry and/or ellipsometry.

In certain embodiments, the training can be supplemented with optical signal obtained by raster scanning the beam from the metrology tool over the coupon or other sample. While the resulting data is collected over a range of locations on the sample, it may be associated with feature profiles (or other geometric characteristics) at one or more specific locations on the sample.

Example Process Flow for Training

FIG. 1 presents an example process flow 101 for producing a model that can be deployed in an optical metrology tool or an optical metrology system. As illustrated, the process begins with an operations 103 in which a collection of substrates (e.g., coupons) is exposed to a variety of different process conditions to produce a variety of different features on the substrates. A goal here is provide a variety of feature profiles and/or shapes in the domain of a model's predictive range. For example, a first substrate is exposed to a first set of process conditions (plasma power, plasma frequency and other plasma conditions, process gas composition, reactor temperature and pressure, mask geometry, etc.), a second substrate is exposed to second set of process conditions, different from the first set, a third substrate is exposed to a third set of process conditions, different from the other two sets of conditions, and so on. At the end of this operation, multiple substrates having multiple different feature profiles and optionally multiple different contours, critical dimensions, etc. In an alternative approach, the same process conditions (e.g., the conditions of a process of record) are applied to each substrate, but intrinsic variability of the processing produces slightly different feature structures (as reflected by profiles, contours, and/or CDs) on the substrates. These intrinsic variations can serve as the basis for a training set.

Next, at an operation 105, optical metrology is performed on the features of the test substrates produced in operation 103. In each case, the resulting optical signals may be associated with the substrate or features that produced those signals, although the profiles or other geometric details of the features typically are not yet known. As should be understood, the optical signals may not directly indicate the profile, critical dimension, contour, or other geometric characteristic of the features that produced those signals.

Optionally, at a process operation 107, the process repeats performing optical metrology on the features under different conditions (e.g., different substrate orientations, different probe beam spot sizes, etc.). As explained, many forms of optical metrology may be employed, and, as well, many modes of executing a single metrology may be employed. Such modes include specific settings of the optical metrology tool such as azimuthal positions and angles of incidence of beams, spot size, spot position on the substrate, rasterized scanning, etc. Further, a pattern recognition pre-step may be employed to remove certain measurements that do not appear to correspond to an expected feature pattern.

Next, in an operation 109, the method performs a form of metrology that directly generates profiles or other geometric characteristics of the features on the test substrates. As indicated, such metrologies are often slow and/or destructive. Examples include various forms of electron microscopy including various forms of TEM (e.g., STEM) and SEM (e.g., x-SEM and CD-SEM), as well as CD-SAXS. The resulting directly measured geometric characteristics of the features are associated with the corresponding optical signals produced by the features in operation 105, and optionally operation 107.

At this point, information for a full training set is available, and, as illustrated at operation 111, the process trains a metrology model using optical metrology signals produced in 105 and, optionally, 107 together with the associated feature profiles, contours, CDs, etc. produced in 109. The resulting model is tested and/or validated as indicated at operation 113. The resulting model may be installed in a metrology tool or system.

The following sequence presents a further example of a process flow.
1. Provide coupons having features produced using a process under consideration (e.g., a process of record) and identify one or more locations where features of interest reside
   Optionally perform pattern recognition at the location(s)
2. From the coupons provided in 1, obtain optical metrology data at the location(s) where features of interest are located
3. From the coupons provided in 1 and using x-SEM, STEM, or other destructive technique or a slow technique such as CD-SAXS that provides a direct representation of the geometric characteristics, obtain profiles or other geometric characteristics of features, at the locations used in 2
4. Using the data from 2 and 3 to train a model that takes as input optical metrology data produced as in 2 and predicts geometric characteristics produced using the process under consideration.

Testing

In testing, an inference is conducted by using the same optical metrology technique (e.g., scatterometry) used to capture the raw data during training, and then feed into the previously established supervised learning model, to predict the CD/profile feature of interest. If training is conducted with metrology conducted at multiple translational positions and/or orientations, then some or all of those positions/orientations may be employed to capture the data fed into the model. Further, if the training is conducted using pattern recognition by a camera, that same pattern recognition may be employed to filter data provided to the model. Still further, if the training is conducted using a raster scan of an optical metrology probe beam, that same raster scan may be conducted during testing and the resulting scan data provided to the model. Of course, test data should be generated under different conditions than the training data. So typically, the test data is generated on substrate features produced using fabrication processes that are in some ways different from those employed to generate the training data. For example, the test data may be generated using combinations of etch conditions that are different from any combination used to generate any of the training data.

Applications

The metrology machine learning models generated as described herein have various applications. The scope of the application of any given model depends, at least in part, on the range of applicability for the model; some models are applicable more generally—in terms of number of processes for which they can validly predict feature characteristics—than other models. For example, a model may be produced for a particular process; e.g., an anisotropic etch process employing a particular chemistry to produce the pattern of a particular design layout.

After effectively training a model, this method can drastically reduce the costs associated with performing destructive testing such as STEM and x-SEM. This is useful if the same type of samples is to be repeatedly used to tune the process on, e.g., >100 coupon samples.

This method also brings in better coupon-to-coupon consistency as random errors & LER/LWR (line edge roughness and line width roughness) on CD/contours/profiles are spatially averaged out by the optical signals. Machine learning is utilized here to map the complex relationship between spectra and CD/contour/profile of feature of interest. When the errors are well controlled, this work flow may be operator free. The nondestructive nature of the measurement also allows multi-etch-step consistency of coupon result. Multiple inference results and multiple features can come out of each etch step of a single coupon, maximizing its value.

A trained metrology model may be employed as a part of a process or associated system for determining the profile, CD, contours, or other geometric characteristic of one or more features on a substrate subject to a device fabrication process. The model and associated metrology system may be used during process development, process monitoring, and/or process modification. Depending on the application, the substrate subjected to the metrology and analysis may be a test coupon or wafer, a production wafer having a partially fabricated device, a production wafer having a fully fabricated device, etc.

Figure 2:
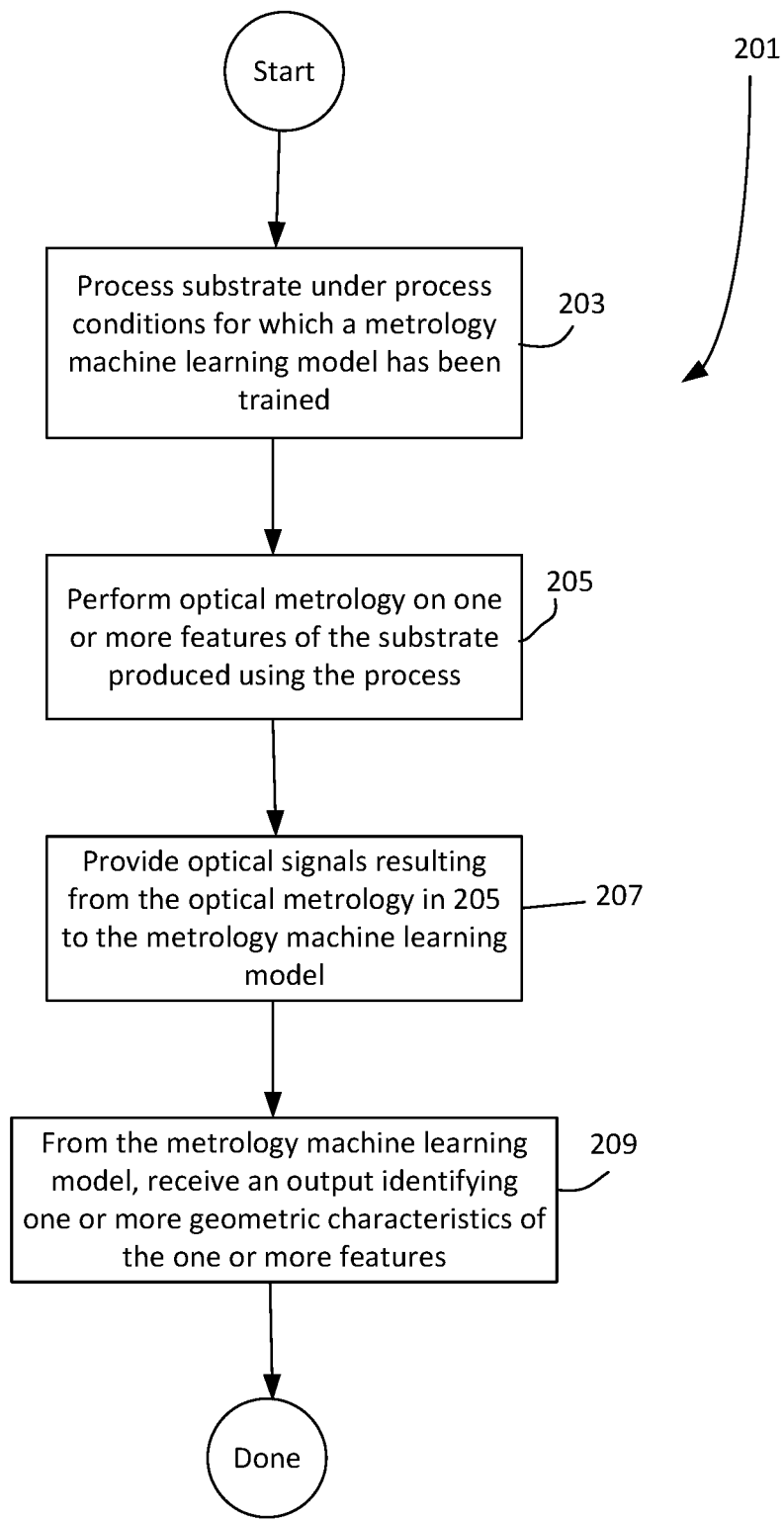
FIG. 2 presents a flow chart for using a metrology machine learning model in accordance with certain method embodiments of this disclosure.

An example process flow for using a metrology machine learning model is depicted in FIG. 2. As shown there, a process 201 begins by processing a substrate under process conditions for which a metrology machine learning model has been trained. See operation 203.

After the substrate has been processed to produce or modify features on the substrate, optical metrology is performed on one or more of the features. See operation 205. The optical metrology technique is the same as the used in the training set for the model. In certain embodiments, operation 205 is performed by moving a beam or spot over multiple positions on the substrate. For example, a light beam may be raster scanned over the processed substrate Per normal operation, the optical metrology technique generates optical signals having characteristics dictated by the feature(s) on the substrate. The optical signals may be reflectance values provided, e.g., as a function of wavelength, polarization state, azimuthal position, etc. Regardless of their information content, the resulting optical signals are provided to the metrology machine learning model, which may have been trained as described above. See operation 207. With using the optical signals, the machine learning model outputs information identifying one or more geometric characteristics of the one or more features. See operation 209.

In certain embodiments, operation 205 is performed only after first performing pattern recognition on the one or more features on the processed substrate. The pattern recognition process may determine that a pattern of the one or more features conforms with an expected pattern. If the pattern does not conform, then the optical metrology operation may be dispensed with.

Terminology

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like. Further, the term "coupon" is sometimes used generically herein to describe any substrate, typically including those used for testing a process and/or for generating model training set data.

A "semiconductor device fabrication operation" as used herein is a unit operation performed during fabrication of semiconductor devices. Typically, the overall fabrication process includes multiple semiconductor device fabrication operations, each performed in its own semiconductor fabrication tool such as an etch and/or deposition plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes. In the context of etch processes, a substrate etch process includes processes that etch a mask layer or, more generally, processes that etch any layer of material previously deposited on and/or otherwise residing on a substrate surface. Such etch process may etch a stack of layers in the substrate. The models described herein may be used to replace destructive metrology techniques with non-destructive optical metrology techniques for any type of semiconductor device fabrication operation.

A "metrology result" as used herein refers to a result produced, at least in part, by measuring features of the processed substrate. The measurement may be made while or after performing the semiconductor device fabrication operation in a reaction chamber operating under the set of process parameter values. In certain embodiments, measuring features of the processed substrate produces profile coordinates. In such embodiments, measuring features of the processed substrate may include performing microscopy (e.g., SEM, x-SEM, TEM, STEM, CD-SEM, CD-SAXS, REM, AFM). Such techniques may be employed to generate profile coordinates directly or indirectly such as by way of a set of geometric profile parameters characterizing a geometry of the feature in the processed substrate (e.g., critical dimension, side wall angles, depth, etc.).

Optical metrology results are produced using optical metrology on features of a processed substrate. In certain embodiments, the optical metrology result is produced by performing reflectometry, dome scatterometry, angle-resolved scatterometry, small-angle X-ray scatterometry, and/or ellipsometry on a processed substrate. An optical metrology output may include any of various values obtained from a detector in an optical metrology tool. examples include reflectance values, optionally over a range of wavelengths (reflectance spectra), polarization information, angular/positional information about the detected optical signals (e.g., angle with respect to the plane of a substrate or a detector or with respect to angle of incidence), ocd parameters), etc. When using optical metrology, the system may obtain profile coordinates by calculating them from measured optical metrology signals using a metrology machine learning model as described herein.

In certain embodiments, the metrology result is provided as a time sequence of measured geometric profiles, reflectance or ellipsometric data, or profile parameters of a substrate feature. These measured metrology results are produced at the different durations of the semiconductor device fabrication operation.

The geometric information about a feature may take various forms. It can be provided as profile coordinates in two or three dimensions and/or a more global parameter such as trench depth, side wall angle, and the like. For repeating structures, one-dimensional information may be provided such as pitch, critical dimension, and the like. In the case of two-dimensional representations, the geometric information of a feature may be a profile (viewed as a cross-section of the substrate in an x-z plane) or as a contour (viewed from above the plane of the substrate in an x-y plane).

Machine learning model—A machine learning model is a trained computational model that takes optical metrology outputs or data (e.g., scatterometry data) and predicts a geometric characteristic of one or more features on a sample. Examples of machine learning models include a random forests models, including deep random forests, neural networks, including recurrent neural networks and convolutional neural networks, restricted Boltzmann machines, recurrent tensor networks, and gradient boosted trees. Each of these has a structure and associated logical sequence of operations (algorithm) well known to those of skill in the art. For example, a neural network includes multiple computational nodes organized in layers configured to successively pass computed results from one layer to the next, on a node-by-node basis. A given node may have connections to one or more nodes in an upstream layer and connections to one or more modes in a downstream layer. The layers may be organized as an input layer, an output layer, and one or more hidden layers. The input side of a neural network may be structured in a way to implement a convolutional neural network. Nodes in a hidden layer or output layer receive inputs from one or other nodes in an upstream layer. Each node operates on its inputs via a function (sometimes an activation function) to produce an output for transmitting to one or more downstream nodes in the next successive layer. Training applies weights to the individual connections between upstream and downstream nodes. The term "classifier" (or classification model) is sometimes used to describe all forms of classification model including deep learning models (e.g., neural networks having many layer) as well as random forests models. More details may be found in "Hands-On Machine Learning with Scikit-Learn and TensorFlow: Concepts, Tools, and Techniques to Build Intelligent Systems," $1^{st}$ Edition, by A. Geron, O'Reilly Media, Inc. (2017); and Deep Learning by Goodfellow et al., MIT Press (2016) which are incorporated herein by reference in their entireties.

Deep learning model—A deep learning model as used herein is a form of classification model. It is also a form of machine learning model. It may be implemented in various forms such as by a neural network (e.g., a convolutional neural network), etc. In general, though not necessarily, it includes multiple layers. Each such layer includes multiple processing nodes, and the layers process in sequence, with nodes of layers closer to the model input layer processing before nodes of layers closer to the model output. In various embodiments, one layer feeds to the next, etc. The output layer may include nodes that represent various classifications. In some implementations, a deep learning model is a model that takes data with very little preprocessing.

In various embodiments, a deep learning model has significant depth (e.g., five or more layers or ten or more layers) and can classify a large or heterogeneous sets of optical metrology data. In some contexts, the term "deep" means that model has more than two (or more than three or more than four or more than five) layers of processing nodes that receive values from preceding layers (or as direct inputs) and that output values to succeeding layers (or the final output). Interior nodes are often "hidden" in the sense that their input and output values are not visible outside the model. In various embodiments, the operation of the hidden nodes is not monitored or recorded during operation.

The nodes and connections of a deep learning model can be trained and retrained without redesigning their number, arrangement, interface with image inputs, etc.

As indicated, in various implementations, the node layers may collectively form a neural network, although many deep learning models have other structures and formats. Some embodiments of deep learning models do not have a layered structure, in which case the above characterization of "deep" as having many layers is not relevant.

Context for Disclosed Computational Embodiments

Certain embodiments disclosed herein relate to systems for generating and/or using metrology models as disclosed herein. Certain embodiments disclosed herein relate to methods for generating and/or using a model implemented on such systems. A system for generating a model may be configured to analyze data for calibrating or optimizing the expressions or relationships used to represent the effects of a semiconductor device fabrication operation on a substrate. A programmed system for using a model may be configured to (i) receive input such as optical metrology data, and (ii) execute instructions that determine characteristics of features on the substrate. A programmed system for using a model may be configured to (i) receive optical metrology data obtain for a plurality of features, (ii) receive SEM, TEM, and/or CD-SAXS data for the same plurality of features, and (iii) execute instructions for training a metrology machine learning model using the data in (i) and (ii).

Many types of computing systems having any of various computer architectures may be employed as the disclosed systems for implementing models, and algorithms for generating, using, and/or optimizing such models. For example, the systems may include software components executing on one or more general purpose processors or specially designed processors such as programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a model on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was preconfigured to interpret the symbols/numeric values, which imparts meaning to the instructions.

The models used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include design layouts, fixed parameter values, floated parameter values, feature profiles, metrology results, and the like. In some cases, a collection of instructions provided in electronic format defines an algorithm for executing a metrology machine learning model such as a neural network. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

In certain embodiments, a model can each be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 3:
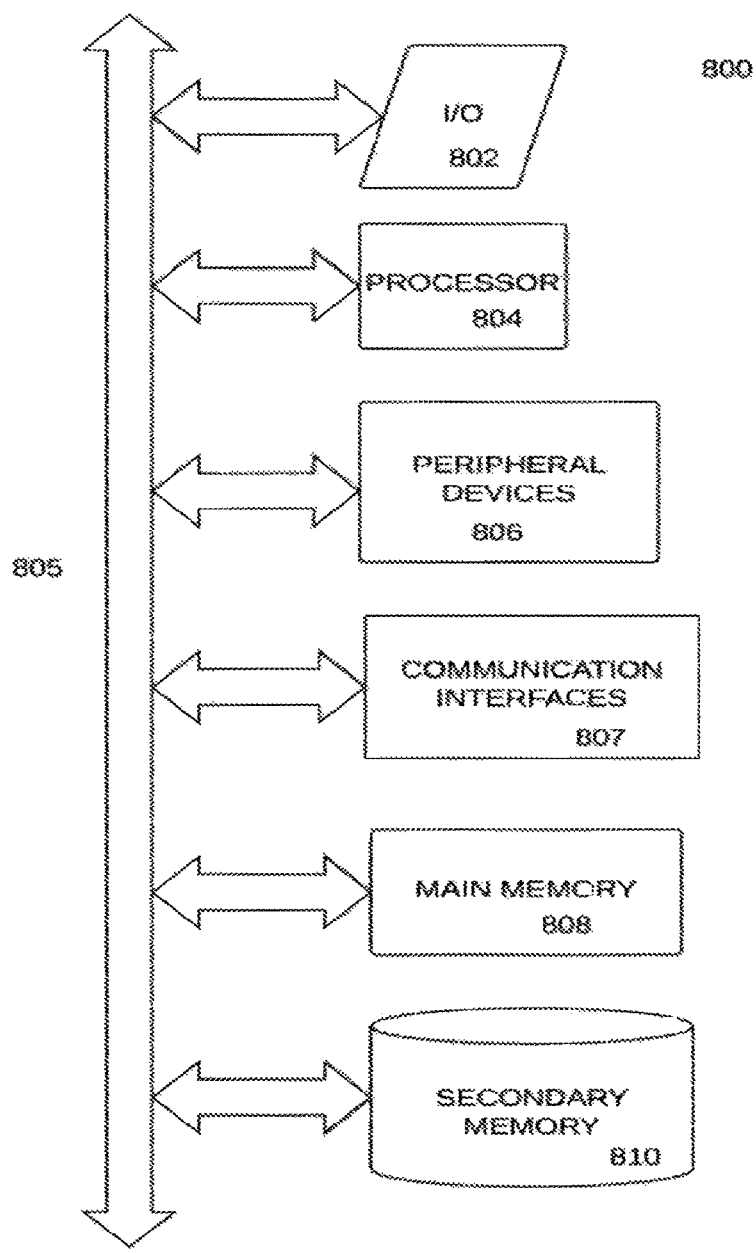
FIG. 3 shows an example computational system that may be used to train and/or run optical metrology machine learning models.

An example computer system 800 is depicted in FIG. 3. As shown, computer system 800 includes an input/output subsystem 802, which may implement an interface for interacting with human users and/or other computer systems depending upon the application. Embodiments of the invention may be implemented in program code on system 800 with I/O subsystem 802 used to receive input program statements and/or data from a human user (e.g., via a GUI or keyboard) and to display them back to the user. The I/O subsystem 802 may include, e.g., a keyboard, mouse, graphical user interface, touchscreen, or other interfaces for input, and, e.g., an LED or other flat screen display, or other interfaces for output. Other elements of embodiments of the disclosure, such as training system of resulting model for interpreting metrology data, may be implemented with a computer system like that of computer system 800, but without I/O.

Program code may be stored in non-transitory media such as persistent storage 810 or memory 808 or both. One or more processors 804 reads program code from one or more non-transitory media and executes the code to enable the computer system to accomplish the methods performed by the embodiments herein, such as those involved with generating or using a process simulation model as described herein. Those skilled in the art will understand that the processor may accept source code, such as statements for executing training and/or interpretation operations, and interpret or compile the source code into machine code that is understandable at the hardware gate level of the processor. A bus couples the I/O subsystem 802, the processor 804, peripheral devices 806, memory 808, and persistent storage 810. In some embodiments, at least some of the computer system features, e.g., processor(s) 804, memory 808, and/or storage 810, are implemented in a cloud or edge network that is physically distinct from an I/O subsystem, if any. In some implementations, the some of the computer system features, e.g., e.g., processor(s) 804, memory 808, and/or storage 810, are distributed over multiple physical devices.

Context for Metrology Tool Embodiments

In various embodiments, a metrology system includes an optical metrology tool and a metrology machine learning model such as one produced using a training process as described herein. The optical metrology tool may include various configurations, but typically includes a light source and a detector for detecting light reflected from, transmitted through, and/or scattered off of features on a substrate being probed. The light source may be monochromatic or polychromatic. The wavelength(s) produced may be in the infrared, visible, ultraviolet, or x-ray range. It may be unpolarized, linearly polarized, circularly polarized, etc. The optical metrology tool may additionally include one or more optical elements for directing light onto substrate features and/or collecting and/or directly light that has interacted with the substrate features. The optical metrology tool may additionally include one or more processors or other processing elements to capture and/or interpret signals from the detector.

In certain embodiments, an optical metrology tool includes a reflectance/ellipsometric spectra generator is part of a tool such as the YieldStar™ scatterometer products available from ASML Netherlands B.V., Veldhoven, The Netherlands. See e.g., Cramer et al., "High-NA optical CD metrology on small in-cell targets enabling improved higher order dose control and process control for logic," Proceedings of SPIE, 10145, Metrology, Inspection, and Process Control for Microlithography XXXI, 101451B (28 Mar. 2017), incorporated herein by reference in its entirety.

Figure 4:
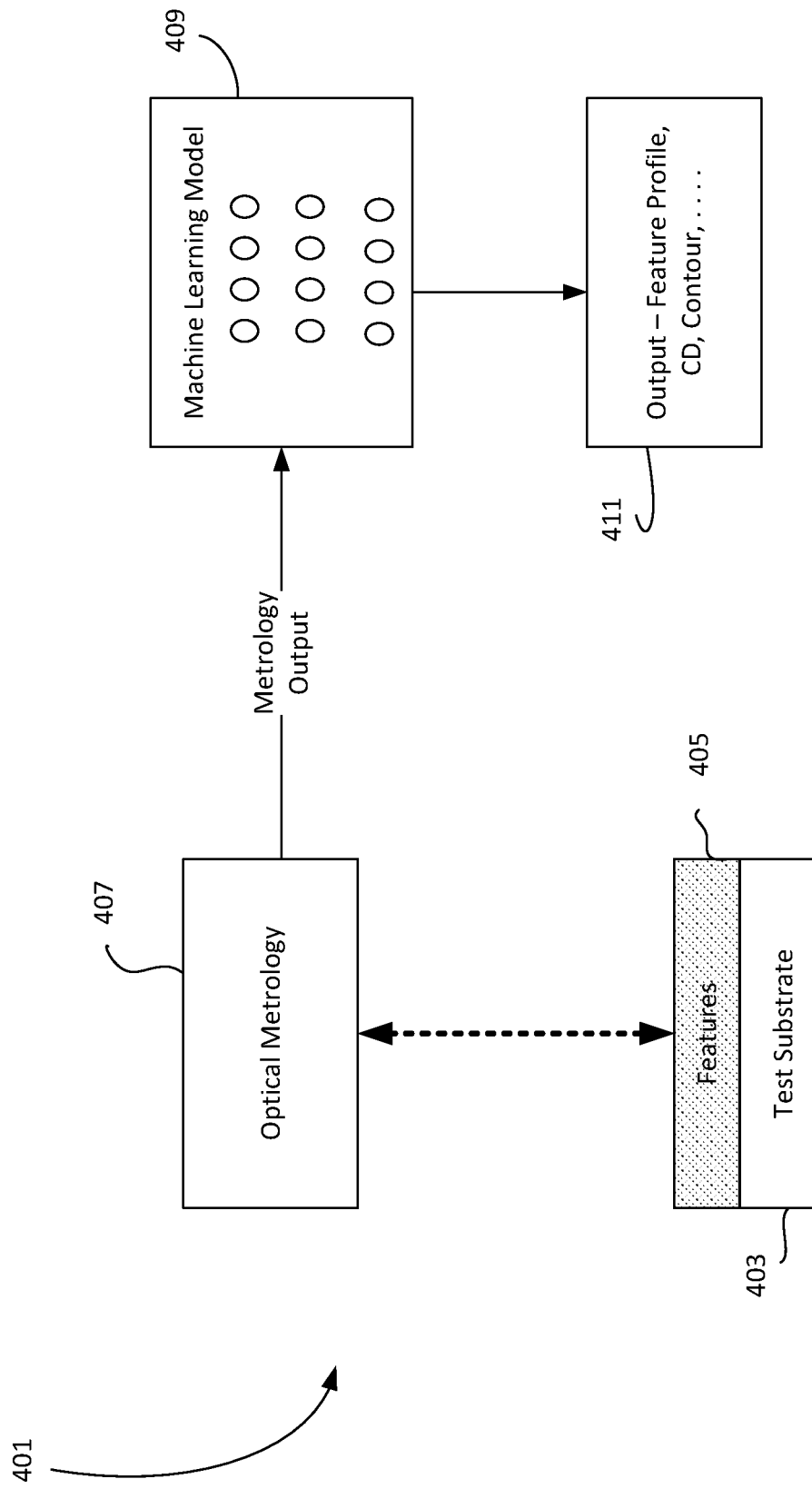
FIG. 4 presents a block diagram of a metrology system including a model configured to generate geometric representations of substrate features, such as would be obtained using electron microscopy, from optical metrology data.

FIG. 4 presents a block diagram of an example metrology system 401. As illustrated, the system includes an optical metrology tool 407 configured to probe substrates such as a substrate 403 having features 405. Optical metrology tool 407 collects optical information from features 405 and generates an optical metrology output (e.g., reflectance intensity versus wavelength or optical critical dimension information). A metrology machine learning model 409 receives the optical metrology output and generates geometric information about the features; e.g., feature profiles, CDs, contours, etc. See output 411. In certain embodiments, the machine learning model 409 is implemented as a neural network.

A system such as metrology system 401 may determine a feature's etch profile using optical information taken directly from a test sample, such as in the case of OCD measurements, followed by treatment of that data by a model or relationship as described herein.

Conclusion

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

What is claimed is:

1. A method of determining a profile, critical dimension, and/or contour of one or more features on a processed substrate, the method comprising:
performing optical metrology on the one or more features on the processed substrate to produce an optical metrology output;
providing the optical metrology output to a metrology machine learning model that has been trained using a training set of (i) profiles, critical dimensions, and/or contours for a plurality of features, and (ii) optical metrology outputs for said plurality of features; and
receiving, from the metrology machine learning model, the profile, critical dimension, and/or contour of the one or more features on the processed substrate.

2. The method of claim 1, further comprising training the metrology machine learning model by producing multiple sets of optical metrology output, each generated for a different orientation and/or location of test features with respect an optical metrology apparatus, for said test features.

3. The method of claim 1, wherein the optical metrology is a scatterometry technique.

4. The method of claim 1, wherein the optical metrology output comprises a reflectance spectra.

5. The method of claim 1, wherein the optical metrology output comprises ellipsometric output data.

6. The method of claim 1, further comprising:
performing pattern recognition on the one or more features on the processed substrate; and
determining that a pattern of the one or more features conforms with an expected pattern.

7. The method of claim 1, wherein performing optical metrology on the one or more features on the processed substrate comprises raster scanning over the processed substrate.

8. The method of claim 1, wherein the profiles, critical dimensions, and/or contours for a plurality of features in the training set were obtained using an electron microscopy technique.

9. The method of claim 1, wherein the profiles, critical dimensions, and/or contours for a plurality of features in the training set were obtained using CD-SAXS.

10. The method of claim 1, wherein the metrology machine learning model was produced using a supervised machine learning technique.

11. The method of claim 1, further comprising decomposing the optical metrology output to produce a reduced set of optical metrology values and providing said reduced set of optical metrology values to the metrology machine learning model.

12. The method of claim 11, wherein decomposing the optical metrology output comprises identifying principal components of the optical metrology output or applying the optical metrology output to an autoencoder.

13. A metrology system comprising:
an optical metrology tool comprising an optical probe source and an optical detector and a processor configured to produce an optical metrology output from data produced by the optical detector when an optical probe is directed onto one or more features on a processed substrate; and
a metrology machine learning model that has been trained using a training set of (i) profiles, critical dimensions, and/or contours for a plurality of features, and (ii) optical metrology outputs for said plurality of features, wherein the metrology machine learning model is configured to:
receive the optical metrology output from the optical metrology tool; and
output the profile, critical dimension, and/or contour of the one or more features on the processed substrate.

14. The metrology system of claim 13, wherein the metrology machine learning model was trained using multiple sets of optical metrology output, each generated for a different orientation and/or location of test features with respect a test optical metrology apparatus.

15. The metrology system of claim 13, wherein the optical metrology tool is a scatterometer.

16. The metrology system of claim 13, wherein the optical metrology output comprises a reflectance spectra.

17. The metrology system of claim 13, wherein the optical metrology output comprises ellipsometric output data.

18. The metrology system of claim 13, further comprising a pattern recognition tool comprising a camera and processor configured to:
perform pattern recognition on the one or more features on the processed substrate; and
determine that a pattern of the one or more features conforms with an expected pattern.

19. The metrology system of claim 13, wherein the optical metrology tool is configured to raster scan over the processed substrate.

20. The metrology system of claim 13, wherein the profiles, critical dimensions, and/or contours for a plurality of features in the training set were obtained using an electron microscopy technique.

21. The metrology system of claim 13, wherein the profiles, critical dimensions, and/or contours for a plurality of features in the training set were obtained using CD-SAXS.

22. The metrology system of claim 13, wherein the metrology machine learning model was generated using a supervised machine learning technique.

23. The metrology system of claim 13, wherein the metrology machine learning model is further configured to:
decompose the optical metrology output to produce a reduced set of optical metrology values and provide said reduced set of optical metrology values to the metrology machine learning model.

24. The metrology system of claim 23, wherein the metrology machine learning model is configured to decompose the optical metrology output by identifying principal components of the optical metrology output or by applying the optical metrology output to an autoencoder.

* * * * *